(12) United States Patent
Tofano et al.

(10) Patent No.: US 8,799,244 B2
(45) Date of Patent: *Aug. 5, 2014

(54) ESTABLISHING PARSE SCOPE

(76) Inventors: Jeffrey Vincent Tofano, San Jose, CA (US); Shawn Hall, San Jose, CA (US)

( * ) Notice: Subject to any disclaimer, the term of this patent is extended or adjusted under 35 U.S.C. 154(b) by 163 days.

This patent is subject to a terminal disclaimer.

(21) Appl. No.: 13/462,861

(22) Filed: May 3, 2012
(Under 37 CFR 1.47)

(65) Prior Publication Data

US 2013/0097131 A1    Apr. 18, 2013

Related U.S. Application Data

(63) Continuation of application No. 12/970,143, filed on Dec. 16, 2010, now Pat. No. 8,195,629.

(30) Foreign Application Priority Data

Jul. 19, 2010    (GB) .................................. 1012109.3

(51) Int. Cl.
  *G06F 17/30*    (2006.01)
  *G06F 3/06*    (2006.01)
(52) U.S. Cl.
  CPC .................................. *G06F 3/0641* (2013.01)
  USPC ........................................................ 707/694

(58) Field of Classification Search
  CPC .................... G06F 17/30159; G06F 17/30303; G06F 3/0641
  USPC .......................................................... 707/694
  See application file for complete search history.

(56) References Cited

U.S. PATENT DOCUMENTS

2005/0182800 A1 *   8/2005   Ashwin et al. ................ 707/203

* cited by examiner

*Primary Examiner* — Richard Bowen (57) ABSTRACT

Example apparatus, methods, and computers control establishing a shared parse scope between two computers that intend to be involved in a shared de-duplication action. One example method includes, upon determining that a first de-duplication logic and a second de-duplication logic are to participate in a shared de-duplication action for an object, controlling the first de-duplication logic to establish a shared parse scope with the second de-duplication logic. Establishing the shared parse scope may include negotiations between the computers, where the negotiations transfer dialect information. The dialect information may take the form of rules. The method may also include persisting the shared parse scope.

18 Claims, 5 Drawing Sheets

Example apparatus and methods establish a shared parse scope between computers involved in data de-duplication. When two computers are both going to process the same de-duplicated data, it is desirable to have the same deterministic process occur on both computers. However, the two computers may initially have, or over time may come to have, different approaches to chunking and/or hashing data during de-duplication. The two approaches may arise due to, for example, differing implementations, differing versions of implementations, differing maturity levels of implementations, and differing approaches. When the two computers have different approaches, it is unlikely the same deterministic approach will occur at both computers. Therefore example apparatus and methods communicate parse scope data to facilitate establishing a common dialect between the computers. Establishing the common dialect increases the likelihood that the same deterministic process will occur at both ends of a collaboration.

US 8,799,244 B2

ESTABLISHING PARSE SCOPE

CROSS-REFERENCE TO RELATED APPLICATIONS

This application is a continuation of U.S. patent application Ser. No. 12/970,143, filed Dec. 16, 2010, which in turn claimed priority, via the patent prosecution highway, from UK Application 1012109.3, filed Jul. 19, 2010.

BACKGROUND

A de-duplication environment can include multiple actors. For example, two different computers may participate in a de-duplication action. A first computer may de-duplicate an object and communicate it to a second computer that will store and index the object. Conventionally, if two computers wanted to work together on an action like a de-duplication action, then a central control would dictate conditions and parameters under which the two computers would communicate and/or co-operate. As the number of communicating and co-operating computers has grown, this type of individualized pair-wise centralized control may provide unsatisfactory results.

De-duplication can involve chunking and hashing an object. When there are two different computers involved in de-duplication, then both of the computers may perform chunking and hashing. The computers may perform the chunking and hashing and other de-duplication actions in different ways. When two computers intend to communicate de-duplicated data or intend to co-operate on a de-duplication task, then the fact that each of the computers may perform chunking and hashing and other de-duplication actions, in different ways can make it difficult, if even possible at all, for the two differently configured computers to work together.

In first generation de-duplication environments there may have been only a single de-duplication approach. Therefore all devices/processes that wanted to de-duplicate, communicate, and/or co-operate simply adhered to that one approach. However, as de-duplication systems matured, devices and processes become more varied and more sophisticated. Different de-duplication systems may have had multi-layered approaches to chunking and hashing and may have employed complex indexing systems that included primary and temporal indexes. The parsers may have become parameterized and customizable based on object context. Therefore it may have become ever more difficult to insure that the same deterministic approach to de-duplication would occur on both ends of a communication.

BRIEF DESCRIPTION OF THE DRAWINGS

The accompanying drawings, which are incorporated in and constitute a part of the specification, illustrate various example methods, apparatuses, and other example embodiments of various aspects of the invention described herein. It will be appreciated that the illustrated element boundaries (e.g., boxes, groups of boxes, other shapes) in the figures represent one example of the boundaries of the elements. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

Example apparatus and methods establish a shared parse scope between computers involved in data de-duplication. When two computers are both going to process the same de-duplicated data, it is desirable to have the same deterministic process occur on both computers. However, the two computers may initially have, or over time may come to have, different approaches to chunking and/or hashing data during de-duplication. The two approaches may arise due to, for example, differing implementations, differing versions of implementations, differing maturity levels of implementations, and differing approaches. When the two computers have different approaches, it is unlikely the same deterministic approach will occur at both computers. Therefore example apparatus and methods communicate parse scope data to facilitate establishing a common dialect between the computers. Establishing the common dialect increases the likelihood that the same deterministic process will occur at both ends of a collaboration.

The following includes definitions of selected terms employed herein. The definitions include various examples and/or forms of components that fall within the scope of a term and that may be used for implementation. The examples are not intended to be limiting.

References to "one embodiment", "an embodiment", "one example", "an example", and other similar terms indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" or "in one example" does not necessarily refer to the same embodiment or example.

Figure 1:
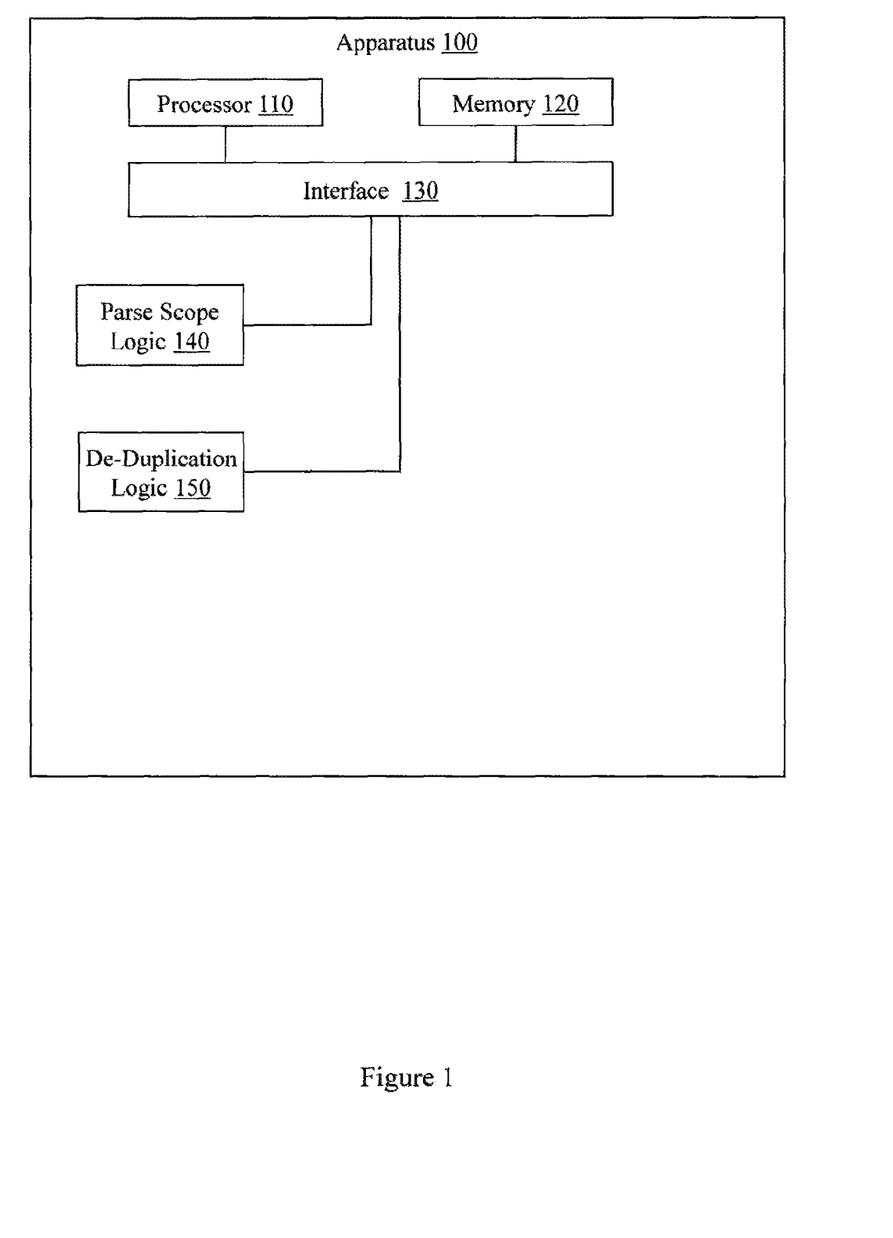
FIG. 1 illustrates an embodiment of an apparatus associated with establishing parse scope.

FIG. 1 illustrates an apparatus 100. Apparatus 100 includes a processor 110, a memory 120, and an interface 130 to connect the processor 110, the memory 120, and a set of logics. In one embodiment, the set, of logics includes parse scope logic 140 and de-duplication logic 150. In different embodiments, the logics may be, for example, circuits, integrated circuits, application specific integrated circuits (ASICs), and other entities.

The parse scope logic 140 may be configured to determine a set of de-duplication rules to be shared between the apparatus 100 and a second, different apparatus that are both part of a de-duplication environment in which an object is to be de-duplicated. In one example, the parse scope logic 140 is configured to determine the set of shared de-duplication rules by transmitting de-duplication rule data to the second apparatus and by receiving de-duplication rule data from the second apparatus. Sending and receiving de-duplication rule data facilitates understanding similarities and differences between computers. Sending and receiving de-duplication rule data also facilitates dynamically updating rule sets in place on co-operating computers. The de-duplication rule data may be communicated during connection establishment before a de-duplication action occurs. Determining an agreed upon set of rules facilitates having the same deterministic approach followed at the different ends of the communication.

The de-duplication rule data describes how an object will be processed. For example, the de-duplication rule data can describe how a layered parser is to be configured, which may in turn control how an object is to be sub-divided and/or hashed. Recall that different objects may be sub-divided different ways based On information known about an object. For example, some objects may be divided using fixed length blocks while other objects may be divided using variable length blocks or delimiter based blocks. De-duplication rule data can also describe how an object is to be indexed. For example, some objects may have temporal and/or spatial relationships that can guide grouping in an index to facilitate efficient retrieval. De-duplication rule data may affect these relationships. De-duplication rule data can also describe how to process an object after chunking and hashing. Post processing can include, for example, compressing an object, encrypting an object, and other actions. De-duplication rule data can also provide an acknowledgement of agreement on a de-duplication rule between two computers.

In one example, the parse scope logic 140 is configured to nest the de-duplication by data reducing the de-duplication rule data. For example, instead of communicating a rule or a rule table, the parse scope logic 140 may chunk and hash a rule and/or rule table and then provide the hash rather than the larger data item. Thus, in one example, a rule for hashing rules may be the first thing negotiated between two communicating, co-operating computers that are going to participate in de-duplication.

The de-duplication logic 150 may be configured to perform de-duplication actions. The de-duplication logic 150 may be controlled, at least in part, by the set of de-duplication rules. In some de-duplication, instances, an object may have previously been de-duplicated and thus may already have been the object of a rules negotiation. In this instance, it may be inefficient to re-negotiate the rules. Therefore, the rules previously negotiated may control the two computers. Thus, the de-duplication logic 150 may be configured to selectively control both the apparatus 100 and the second apparatus to accept a set of de-duplication rules previously negotiated or established for the object.

In one example, the apparatus 100 may wish to act as a dominant device and therefore the de-duplication logic 150 can be configured to selectively control the second apparatus to accept a set of de-duplication rules associated with the apparatus 100. In another example, the second apparatus may wish to act as a dominant device and therefore the de-duplication logic 150 may be configured to selectively control the apparatus 100 to accept a set of de-duplication rules associated with the second apparatus. After the shared de-duplication rules are established, the de-duplication logic 150 may de-duplicate the object as controlled by the set of shared de-duplication rules.

Figure 2:
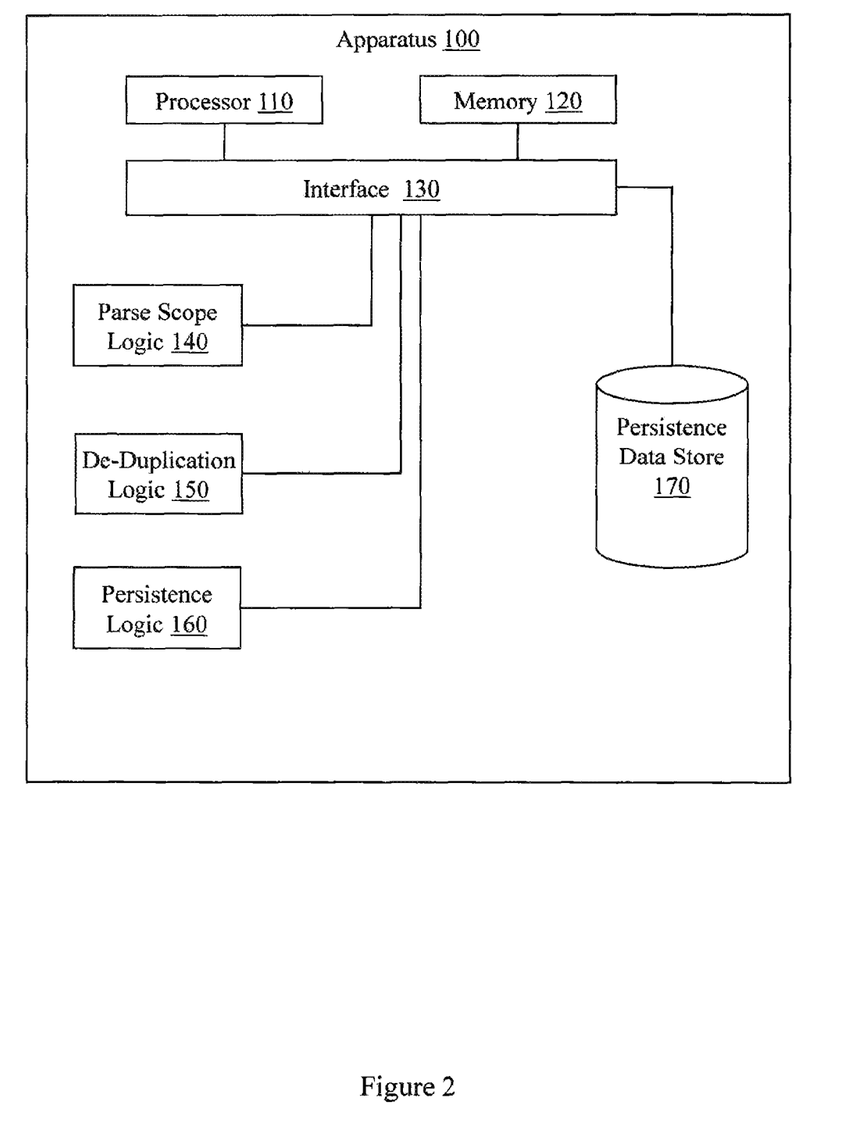
FIG. 2 illustrates an embodiment of an apparatus associated with establishing parse scope.

FIG. 2 illustrates another embodiment of apparatus 100. This embodiment of apparatus 100 includes a persistence logic 160 and a persistence data store 170. The persistence logic 160 is configured to persist the set of shared de-duplication rules. The shared de-duplication rules may be persisted in the apparatus 100, in the persistence data store 170, in the second apparatus, in the object, or in other locations. Persisting the shared de-duplication rules facilitates preventing constantly or unnecessarily re-negotiating rules. Persisting the shared de-duplication rules also facilitates propagating rules throughout a de-duplication environment. Rather than tasking a central actor to propagate current or evolving rules throughout an environment, the rules may be propagated from machine to machine or process to process as the machines and processes communicate. In this approach, only machines that are actually participating in de-duplication will be updated with evolving dialects. However, in one example, a replication event may be designed to update multiple machines with a common dialect.

Some portions of the detailed descriptions that follow are presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations include physical manipulations of physical quantities. Usually, though not necessarily, the physical quantities take the form of electrical or magnetic signals capable of being stored, transferred, combined, compared, and otherwise manipulated in a logic. The physical manipulations transform electronic components and/or data representing physical entities from one state to another.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be used to implement an example methodology. Blocks may be combined or separated into multiple components. Furthermore, additional and/or alternative methodologies can employ additional, not illustrated blocks.

Figure 3:
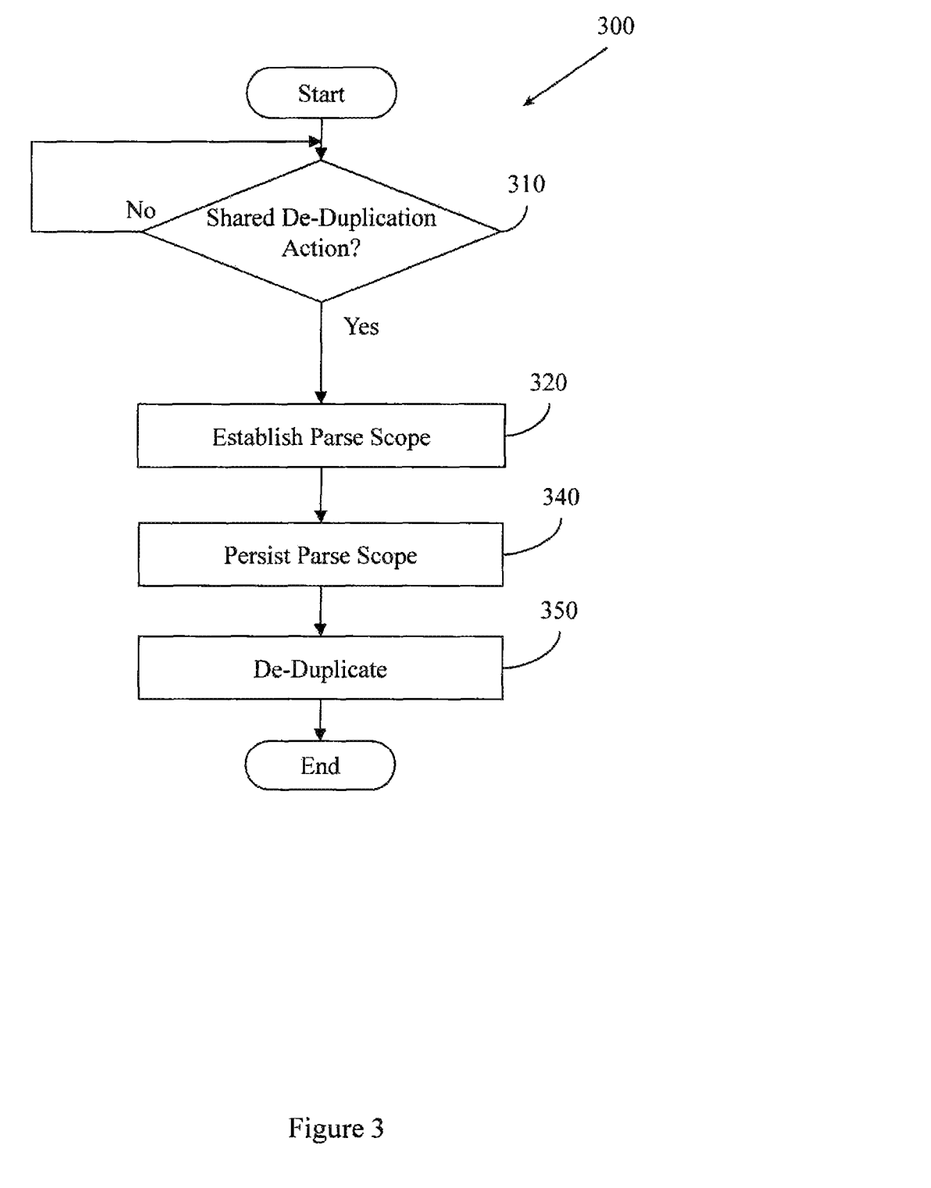
FIG. 3 illustrates an embodiment of a method associated with establishing parse scope.

FIG. 3 illustrates a method 300. At 310, method 300 includes determining that a first de-duplication logic and a second de-duplication logic are to participate in a shared de-duplication action for an object. Once it has been determined that two de-duplication logics will communicate and/or collaborate, method 300 proceeds to 320.

At 320, method 300 includes controlling the first de-duplication logic to establish a shared parse scope with the second de-duplication logic. In one example, controlling 320 the first de-duplication logic to establish the shared parse scope includes controlling the first de-duplication logic to provide dialect data to the second de-duplication logic. The dialect data may include, but is not limited to, a rule, a hash of a rule, a rule identifier, a plurality of rules, a hash of the plurality of rules, and a plurality of rule identifiers. A dialect refers to a current set of information involved in de-duplication. A dialect can therefore include information about how to process an object, what to do with an object once it has been data reduced, how to decide how to data reduce an object, how to store a reduced object, how to balance performance versus reduction rate, and other information. When a rule is to be provided as part of the dialect data, in different embodiments either a rule or a hash of a rule can be provided. When a hash of a rule is provided, this may be termed "nesting the de-duplication dialect". A rule may describe how an object is to be processed. A rule may also provide information about an object, where a processing approach can be determined from the information.

Method 300 can also include, at 340, persisting the parse scope. Persisting the parse scope at 340 prevents unnecessary renegotiations and re-determinations of parse scope. The shared parse scope may be persisted in the object in a first non-reduced state, in the object in a second reduced state, in the first de-duplication logic, in the second de-duplication logic, and elsewhere. Persisting the shared parse scope comprises storing one or more of, a rule, a hash of a rule, a plurality of rules, a hash of the plurality of rules, a parse parameter, and context data concerning parsing performed according to the shared parse scope. In one embodiment, the shared parse scope includes a set of de-duplication rules.

Method 300 can also include, at 350, controlling the first de-duplication logic to perform a portion of the shared de-duplication action as controlled by the shared parse scope. The shared de-duplication action may be, for example, data reducing the object by chunking and hashing. The shared de-duplication action may result in data reducing the object from a first non-reduced state to a second reduced state.

Not all dialects are communicated by one-to-one negotiations. A de-duplication environment may experience a replication event that seeks to more broadly distribute a dialect. A replication event may occur independent of an intended communication between de-duplication logics. Therefore method 300 can also include controlling the first de-duplication logic and the second de-duplication logic to accept a dialect associated with a replication event. The replication event may involve distribution of an updated parse scope. Like the dialect or alternate dialect, the updated parse scope may include a rule, a hash of a rule, a rule identifier, a plurality of rules, a hash of the plurality of rules, and a plurality of rule identifiers.

In one example, a method may be implemented as computer executable instructions. Thus, in one example, a computer readable medium may store computer executable instructions that if executed by a computer (e.g., data reduction server) cause the computer to perform method 300. While executable instructions associated with method 300 are described as being stored on a computer readable medium, it is to be appreciated that executable instructions associated with other example methods described herein may also be stored on a computer readable medium.

"Computer readable medium", as used herein, refers to a medium that stores signals, instructions and/or data. A computer readable medium may take forms, including, but not limited to, non-volatile media, and volatile media. Non-volatile media may include, for example, optical disks, and magnetic disks. Volatile media may include, for example, semiconductor memories, and dynamic memory. Common forms of a computer readable medium may include, but are not limited to, a floppy disk, a flexible disk, a hard disk, a magnetic tape, other magnetic medium, an ASIC, a CD (compact disk), other optical medium, a RAM (random access memory), a ROM (read only memory), a memory chip or card, a memory stick, and other media from which a computer, a processor, or other electronic device can read.

Figure 4:
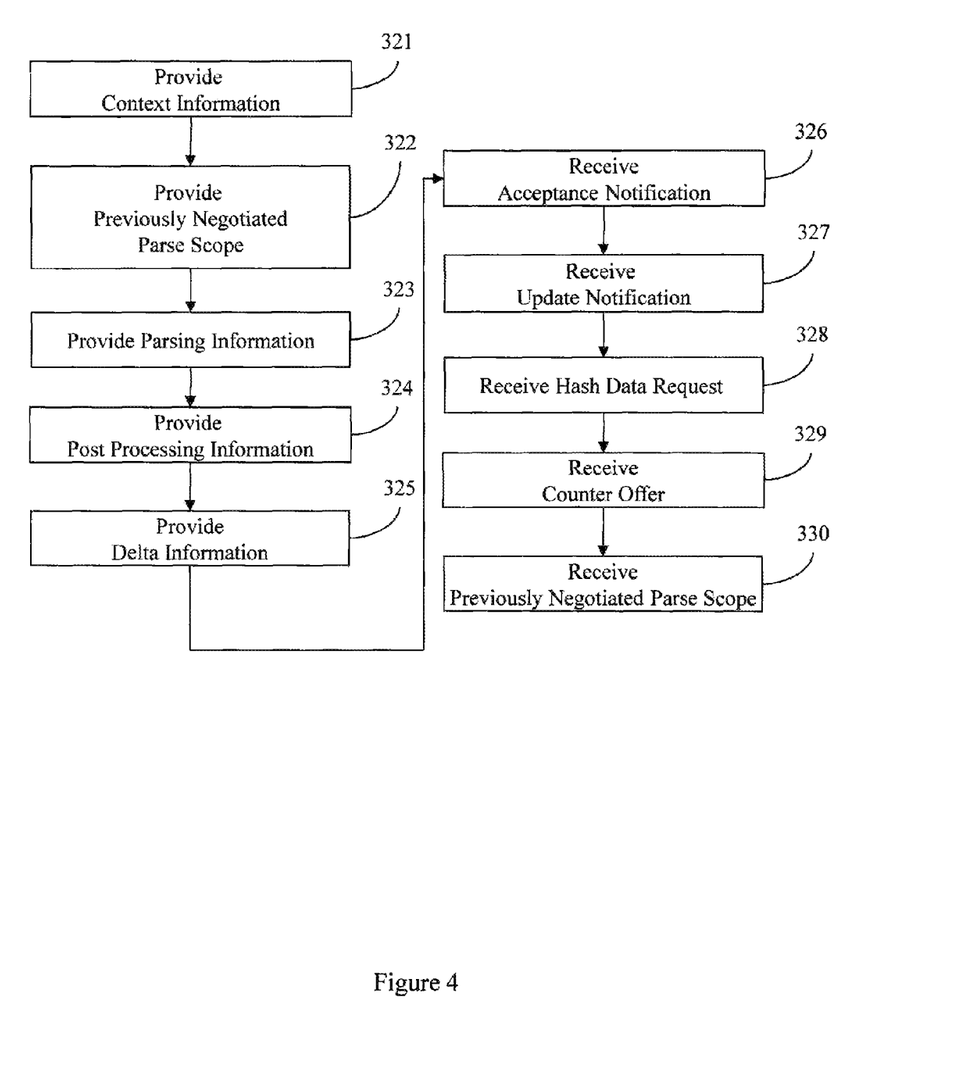
FIG. 4 illustrates an embodiment of a portion of a method associated with establishing parse scope.

FIG. 4 illustrates additional detail for establishing the parse scope at 320 (FIG. 3). Establishing the parse scope at 320 can include providing dialect data, receiving feedback data, and responding to the feedback data.

Providing the dialect data can include, at 321, providing information about a context associated with an object to be de-duplicated. The context information may describe, for example, an object type, an object size, an object creation time, an object author, an object preferred processing scheme, and other information. The context information may be used to select between rules, to select between dialects, and to take other actions. For example, a file having a first file type (e.g., XML) may be chunked in a first way (e.g., delimiter based) while a file having a second file type (e.g., video) may be chunked in a second way (e.g., rolling hash variable chunk size).

Providing the dialect data can also include, at 322, providing information identifying a previously negotiated shared parse scope associated with an object. An object may be self-aware about the fact that it has previously caused a negotiation of a rule set and a shared parse scope. When an object has information about a previous negotiation, computers that process the object may be bound to use parse scope developed during the previous negotiation. Using a previously negotiated parse scope facilitates propagating changes negotiated between two computers to other computers and prevents too many independent dialects from developing in a de-duplication environment.

Providing the dialect data can also include, at 323, providing information identifying how an object is to be parsed. This may include, for example, how to divide (e.g., chunk) an object, how to hash the object, and other actions. The parse information can include partitioning parameters comprising fixed, variable, or delimiter based partitioning parameters, hash function identifiers, and parse layering order parameters. The information about how to parse an object may be provided as a rule.

Providing the dialect data can also include, at 324, providing information identifying an action to be performed after an object is parsed. These actions can include, for example, encrypting an object, compressing an object, further reducing the object, archiving the object, and other actions. In one embodiment, an object may be chunked and hashed but not stored. This may occur in a security scenario. For example, a de-duplication logic may be interested in determining whether an object has been encountered before and, if so, whether the encounter was a positive experience. Some encounters may be associated with attempted security breaches. Therefore, a de-duplication logic may be configured to simply recognize objects to determine whether to allow the object to be transmitted, stored, or processed in some other way. Therefore the data identifying an action to be performed after an object is parsed can include information concerning verifying the existence of an object and information concerning transmitting an object. In this example, the shared de-duplication action may be a security related action that includes determining a hash without transmitting the object or adding the object to a persistent data de-duplication data store.

Providing the dialect data can also include, at 325, providing information identifying delta processing for a chunk. The delta information can include, for example, a delta hash function, and a delta storage schema for an object. Delta information facilitates processing chunks that are neither duplicates nor completely unique chunks. The delta information may identify, for example, how many weak hashes are to be computed in parallel for a chunk to facilitate determining the degree to which a chunk matches or does not match a previously encountered chunk.

Establishing a parse scope can be a collaborative effort. Therefore controlling the first de-duplication logic at 320 (FIG. 3) to establish the shared parse scope also includes receiving feedback data from the second de-duplication logic. Like the dialect data can identify rules, context, and other information, the feedback data can also identify rules, context, and other information. The feedback data may be produced by the second computer in response to the dialect data. The feedback data can indicate that the second computer is going to go along with the first computer, that the second computer is going to propose something different, that the second computer has knowledge about a previously negotiated parse scope, and other information.

Receiving the feedback information can include, at 326, receiving an acceptance notification that identifies that the second de-duplication logic is aware of the dialect identified by the dialect data and agrees to use the dialect identified by the dialect data. In this case the negotiation is more of an acknowledgement that both actors already have the same dialect.

Receiving the feedback information can also include, at 327, receiving an update notification that identifies that the second de-duplication logic was not aware of the dialect identified by the dialect data but agrees to use the dialect identified by the dialect data. As part of the update notification, the second de-duplication logic indicates that it has updated its dialect as a function of receiving the dialect data.

Receiving the feedback information can also include, at 328, receiving feedback information asking for the actual data when the dialect data was provided as a hash. Therefore the feedback notification may include a request notification that identifies a hash of an item in the dialect for which a corresponding actual item is requested by the second de-duplication logic.

Sometimes the second de-duplication logic may not simply acquiesce to the first de-duplication logic. For example, the second de-duplication logic may have more recent or more complete information about a dialect. Therefore receiving the feedback information may include, at 329, receiving a counteroffer notification that identifies an alternative dialect that is being proposed by the second de-duplication logic. The alternative dialect may be identified by alternative dialect data including a rule, a hash of a rule, a rule identifier, a plurality of rules, a hash of the plurality of rules, and a plurality of rule identifiers. The counteroffer may be provided with different levels of insistence. For example, the second de-duplication logic may suggest an alternate dialect or may insist on an alternate dialect.

The object may have been previously encountered by the second de-duplication logic. In that encounter, a parse scope may have been determined for the object. Therefore receiving the feedback information can include, at 330, receiving an acknowledgement notification that identifies that the second de-duplication logic will participate in the shared de-duplication action as controlled by a persisted parse scope previously negotiated for the object. The acknowledgement notification will also likely control the first de-duplication logic to participate in the shared de-duplication action using the previously negotiated and persisted parse scope.

So far, establishing the parse scope at 320 (FIG. 3) has included providing dialect data and receiving feedback data generated in response to the dialect data. Establishing the parse scope at 320 can also include responding to the feedback data. Responding to the feedback data can include, upon receiving an acknowledgement notification, establishing the persisted parse scope as the shared parse scope. Responding to the feedback data can also include, upon receiving an acceptance notification, establishing the dialect as the shared parse scope. Responding to the feedback data can also include, upon receiving an update notification, establishing the dialect as the shared parse scope. If the second de-duplication logic asks for an actual item by providing a request notification, then responding to the feedback data can also include providing the corresponding actual item requested by the second de-duplication logic.

If a counter-offer notification is received, then establishing the parse scope at 320 can include providing a dominance notification that identifies that the first de-duplication logic and the second de-duplication logic are to use the dialect identified by the dialect data. If the first de-duplication logic is not so dominant, then responding to a counter-offer can also include providing an acceptance notification that identifies that the first de-duplication logic is aware of the alternate dialect identified by the alternate dialect data and agrees to use the alternate dialect identified by the alternate dialect data. Similarly, if the first de-duplication logic is not dominant, then responding to the feedback data can include providing an update notification that identifies that the first de-duplication logic was not aware of the alternate dialect identified by the alternate dialect data, that the first de-duplication logic agrees to use the alternate dialect identified by the alternate dialect data, and that the first de-duplication logic has been updated as a function of receiving the alternate dialect data.

Like the first de-duplication logic can nest the de-duplication by providing hashes of items, so too can the second de-duplication logic nest the de-duplication by providing hashes. Therefore the first de-duplication logic may provide a request notification that identifies a hash of a rule for which a corresponding actual rule is requested by the first de-duplication logic.

Upon determining that the second de-duplication logic has provided information about a previously negotiated dialect, establishing the parse scope at 320 can include providing an acknowledgement notification that identifies that the first de-duplication logic will participate in the shared de-duplication action as controlled by a persisted parse scope previously negotiated for the object.

Figure 5:
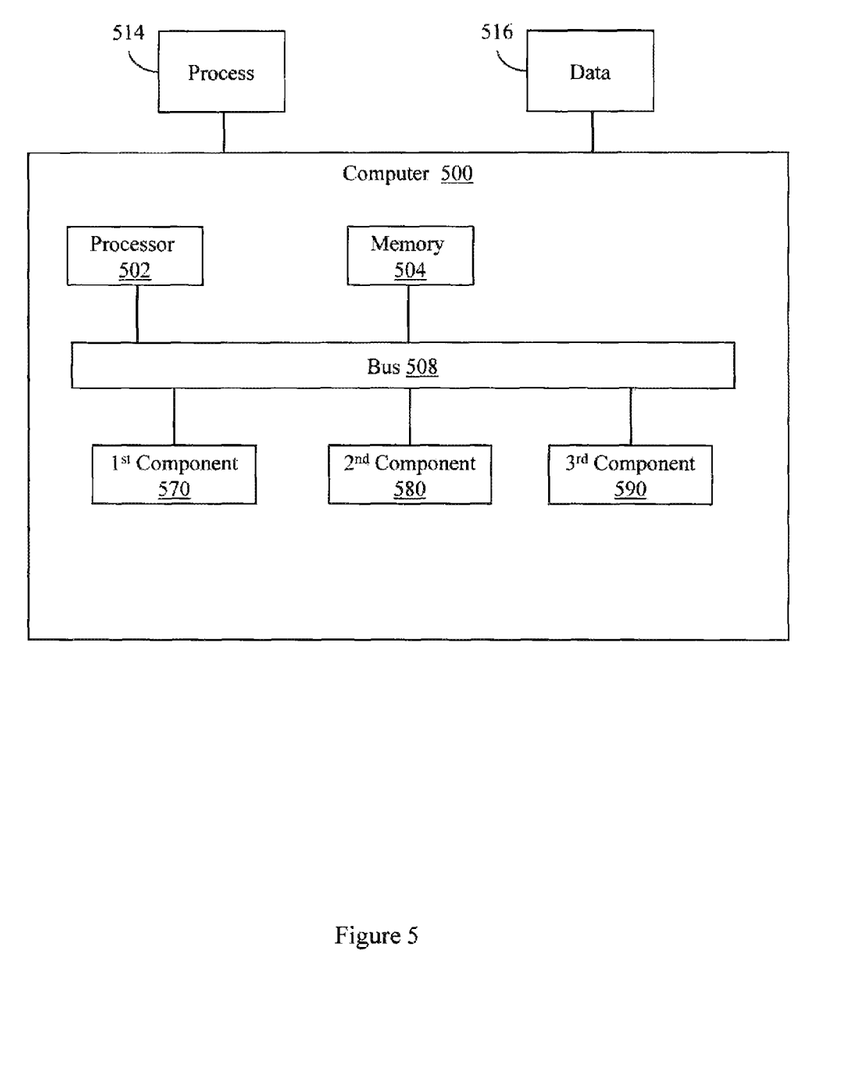
FIG. 5 illustrates an embodiment of a computer configured to control parse scope.

FIG. 5 illustrates a computer 500. Computer 500 includes a processor 502 and a memory 504 that are operably connected by a bus 508. In one example, the computer 500 may include a first component 570 configured to negotiate a set of rules by which two de-duplication logics agree to be bound with respect to performing a de-duplication action on an object. The first component 570 can therefore implement a portion of method 300 described above. Computer 500 can also include a second component 580 that is configured to perform the de-duplication action as controlled by the set of rules. Computer 500 can also include a third component 590 that is configured to persist the set of rules to control future de-duplication actions associated with the object. The first component 570, the second component 580, and the third component 590 may be, for example, ASICs inserted into computer 500. While three separate components are illustrated, one skilled in the art will appreciate that a greater and/or lesser number of components could be present in computer 500 and tasked with performing method 300.

Generally describing an example configuration of the computer 500, the processor 502 may be a variety of various processors including dual microprocessor and other multiprocessor architectures. A memory 504 may include volatile memory (e.g., RAM (random access memory)) and/or non-volatile memory (e.g., ROM (read only memory)). The memory 504 can store a process 514 and/or a data 516, for example. The process 514 may be a data reduction process and the data 516 may be an object to be data reduced.

The bus 508 may be a single internal bus interconnect architecture and/or other bus or mesh architectures. While a single bus is illustrated, it is to be appreciated that the computer 500 may communicate with various devices, logics, and peripherals using other busses (e.g., PCIE (peripheral component interconnect express), 1394, USB (universal serial bus), Ethernet). The bus 508 can be types including, for example, a memory bus, a memory controller, a peripheral bus, an external bus, a crossbar switch, and/or a local bus.

While example apparatus, methods, and articles of manufacture have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the invention is not limited to the specific details, the representative apparatus, and illustrative examples shown and described. Thus, this application is intended to embrace alterations, modifications, and variations that fall within the scope of the appended claims.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". When the applicants intend, to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

What is claimed is:

1. An apparatus, comprising:
   a processor;
   a memory; and
   an interface to connect the processor, the memory, and a set of logics, the set of logics comprising:
   a parse scope logic configured to determine a set of de-duplication rules shared between the apparatus and a second, different apparatus, where the apparatus and the second apparatus are both part of a de-duplication environment in which an object is to be de-duplicated, where the parse scope logic is configured to determine the set of de-duplication rules by transmitting de-duplication rule data to the second apparatus and by receiving return de-duplication rule data from the second apparatus; and
   a de-duplication logic configured to de-duplicate the object as controlled by the set of shared de-duplication rules,
   where the de-duplication rule data includes first information about a context associated with an object to be de-duplicated, second information identifying a previously negotiated shared parse scope associated with an object, third information identifying how an object is to be parsed, fourth information identifying an action to be performed after an object is parsed, fifth information identifying one or more of, a delta hash function, and a delta storage schema for an object, or sixth information identifying balancing rules for balancing performance and reduction, and
   where the return de-duplication rule data includes an acceptance notification that identifies that the second apparatus is aware of a dialect identified by the de-duplication rule data and agrees to use the dialect, an update notification that identifies that the second apparatus was not aware of the dialect, that the second apparatus agrees to use the dialect, and that the second apparatus has been updated as a function of receiving the de-duplication rule data, a counteroffer notification comprising an alternative dialect data, where the alternative dialect data comprises one or more of, a rule, a hash of a rule, a rule identifier, a plurality of rules, a hash of the plurality of rules, and a plurality of rule identifiers, where the alternative dialect data is associated with an alternate dialect in use by the second apparatus, a request notification that identifies a hash of an item in the dialect for which a corresponding actual item is requested by the second apparatus, or an acknowledgement notification that identifies that the second apparatus will participate in the shared de-duplication action as controlled by a persisted parse scope previously negotiated for the object.

2. The apparatus of claim 1, where de-duplication rule data describes one or more of, how a layered parser is to be configured, how an object is to be sub-divided, how an object is to be hashed, how an object is to be indexed, how an object is to be compressed, how an object is to be encrypted, and an acknowledgement of agreement on a de-duplication rule.

3. The apparatus of claim 1, where the parse scope logic is configured to nest the de-duplication rule by data reducing the de-duplication rule data.

4. The apparatus of claim 1, comprising a persistence logic configured to persist the set of de-duplication rules in one or more of, the apparatus, the second apparatus, and the object.

5. The apparatus of claim 4, where the persistence logic is configured to selectively control the second apparatus to accept a set of de-duplication rules associated with the apparatus, where the persistence logic is configured to selectively control the apparatus to accept a set of de-duplication rules associated with the second apparatus, and where the persistence logic is configured to selectively control both the apparatus and the second apparatus to accept a set of de-duplication rules previously negotiated for the object.

6. A non-transitory computer readable medium storing computer executable instructions that when executed by a computer control the computer to perform a method, the method comprising:
   upon determining that a first de-duplication logic and a second de-duplication logic are to participate in a shared de-duplication action for an object,
   controlling the first de-duplication logic to establish a shared parse scope with the second de-duplication logic, by:
      controlling the first de-duplication logic to provide dialect data to the second de-duplication logic, and
      receiving feedback data from the second de-duplication logic, the feedback data being produced in response to the dialect data,
   the dialect data comprising one or more of, a rule, a hash of a rule, a rule identifier, a plurality of rules, a hash of the plurality of rules, and a plurality of rule identifiers, where the rule comprises one or more of: first information about a context associated with an object to be de-duplicated, second information identifying a previously negotiated shared parse scope associated with an object, third information identifying how an object is to be parsed; fourth information identifying an action to be performed after an object is parsed; fifth information identifying one or more of, a delta hash function, and a delta storage schema for an object; and sixth information identifying balancing rules for balancing performance and reduction;
   where the feedback data comprising one or more of:
      an acceptance notification that identifies that the second de-duplication logic is aware of the dialect identified by the dialect data and agrees to use the dialect identified by the dialect data, an update notification that identifies that the second de-duplication logic was not aware of the dialect identified by the dialect data, that the second de-duplication logic agrees to use the dialect identified by the dialect data, and that the second de-duplication logic has been updated as a function of receiving the dialect data, a counteroffer notification comprising an alternative dialect data, where the alternative dialect data comprises one or more of, a rule, a hash of a rule, a rule identifier, a plurality of rules, a hash of the plurality of rules, and a plurality of rule identifiers, where the alternative dialect data is associated with an alternate dialect in use by the second de-duplication logic, a request notification that identifies a hash of an item in the dialect for which a corresponding actual item is requested by the second de-duplication logic, and an acknowledgement notification that identifies that the second de-duplication logic will participate in the shared de-duplication action as controlled by a persisted parse scope previously negotiated for the object and persisting the shared parse scope.

7. The computer readable medium of claim 6, the method comprising:
controlling the first de-duplication logic to perform a portion of the shared de-duplication action on the object as controlled by the shared parse scope.

8. The computer readable medium of claim 6, the method comprising:
upon receiving an acknowledgement notification, establishing the persisted parse scope as the shared parse scope;
upon receiving an acceptance notification, establishing the dialect as the shared parse scope;
upon receiving an update notification, establishing the dialect as the shared parse scope; and
upon receiving a request notification, providing the corresponding actual item requested by the second de-duplication logic.

9. The computer readable medium of claim 6, the method comprising:
upon receiving a counteroffer notification:
providing a dominance notification that identifies that the first de-duplication logic and the second de-duplication logic are to use the dialect identified by the dialect data;
providing an acceptance notification that identifies that the first de-duplication logic is aware of the alternate dialect identified by the alternate dialect data and agrees to use the alternate dialect identified by the alternate dialect data;
providing an update notification that identifies that the first de-duplication logic was not aware of the alternate dialect identified by the alternate dialect data, that the first de-duplication logic agrees to use the alternate dialect identified by the alternate dialect data, and that the first de-duplication logic has been updated as a function of receiving the alternate dialect data;
providing a request notification that identifies a hash of a rule associated with the alternate dialect for which a corresponding actual rule is requested by the first de-duplication logic; and
providing an acknowledgement notification that identifies that the first de-duplication logic will participate in the shared de-duplication action as controlled by a persisted parse scope previously negotiated for the object.

10. The computer readable medium of claim 6, where the shared de-duplication action comprises data reducing the object from a first non-reduced state to a second reduced state.

11. The computer readable medium of claim 10, the method comprising persisting the shared parse scope in one or more of, the object in the first non-reduced state, the object in the second reduced state, the first de-duplication logic, and the second de-duplication logic.

12. The computer readable medium of claim 11, where persisting the shared parse scope comprises storing one or more of, a rule, a hash of a rule, a plurality of rules, a hash of the plurality of rules, a parse parameter, and context data concerning parsing performed according to the shared parse scope, and where establishing the shared parse scope with the second de-duplication logic can be based, at least in part, on a hash of a persisted shared parse scope.

13. The computer readable medium of claim 6, where the shared parse scope comprises one or more de-duplication rules.

14. The computer readable medium of claim 6, where the third information comprises one or more of, partitioning parameters comprising fixed, variable, or delimiter based partitioning parameters, hash function identifiers, and parse layering order parameters, where the partitioning parameters can be configured at one or more of, a file scope level, an object scope level, and a sub-object scope level.

15. The computer readable medium of claim 6, where the fourth information comprises one or more of, information concerning compressing a reduced object, information concerning encrypting a reduced object, information concerning verifying the existence of an object, and information concerning transmitting an object.

16. The computer readable medium of claim 6, where the shared de-duplication action is a security related action that includes determining a hash without transmitting the object or adding the object to a persistent data de-duplication data store.

17. The computer readable medium of claim 6, the method comprising controlling the first de-duplication logic and the second de-duplication logic to accept a dialect associated with a replication event,
where the replication event comprises distribution of an updated parse scope comprising one or more of, a rule, a hash of a rule, a rule identifier, a plurality of rules, a hash of the plurality of rules, and a plurality of rule identifiers; and
where the replication event occurs independent of an intended communication between de-duplication logics.

18. A computer, comprising:
a first component configured to negotiate a set of rules by which two de duplication logics agree to be bound with respect to performing a de-duplication action on an object;
a second component configured to perform the de-duplication action as controlled by the set of rules; and
a third component configured to persist the set of rules to control future de-duplication actions associated with the object,
where the set of rules include rules describing how a layered parser is to be configured, how an object is to be sub-divided, how an object is to be hashed, how an object is to be indexed, how an object is to be compressed, how an object is to be encrypted, and an acknowledgement of agreement on a de-duplication rule, where the set of rules includes first information about a context associated with an object to be de-duplicated, second information identifying a previously negotiated shared parse scope associated with an object, third information identifying how an object is to be parsed, fourth information identifying an action to be performed after an object is parsed, fifth information identifying one or more of, a delta hash function, and a delta storage schema for an object, and sixth information identifying balancing rules for balancing performance and reduction, and where the first component receives, in response to providing the set of rules, return de-duplication rule data that includes an acceptance notification that identifies that a second apparatus to which the set of rules was provided is aware of a dialect identified by the de-duplication rule data and agrees to use the dialect, an update notification that identifies that the second apparatus was not aware of the dialect, that the second apparatus agrees to use the dialect, and that the second apparatus has been updated as a function of receiving the de-duplication rule data, a counteroffer notification comprising an alternative dialect data, where the alternative dialect data comprises one or more of, a rule, a hash of a rule, a rule identifier, a plurality of rules, a hash of the plurality of rules, and a plurality of rule identifiers where the alternative dialect data is associated with an alternate dialect in use by the second apparatus, a request notification that identifies a hash of an item in the dialect for which a corresponding actual item is requested by the second apparatus, or an acknowledgement notification that identifies that the second apparatus will participate in the shared de-duplication action as controlled by a persisted parse.

* * * * *

UNITED STATES PATENT AND TRADEMARK OFFICE
CERTIFICATE OF CORRECTION

| | | |
|---|---|---|
| PATENT NO. | : 8,799,244 B2 | Page 1 of 1 |
| APPLICATION NO. | : 13/462861 | |
| DATED | : August 5, 2014 | |
| INVENTOR(S) | : Tofano et al. | |

It is certified that error appears in the above-identified patent and that said Letters Patent is hereby corrected as shown below:

In the Specification:

In Column 3, line 11, delete "based On information" and insert --based on information--.

In Column 3, line 37, delete "de-duplication, instances," and insert --de-duplication instances,--.

In Column 5, line 65, delete "while: a file" and insert --while a file--.

In Column 9, line 19, delete "intend, to" and insert --intend to--.

In the Claims:

In Column 14, line 9, delete "identifiers where" and insert --identifiers, where--.

Signed and Sealed this
Fourteenth Day of October, 2014

Michelle K. Lee
*Deputy Director of the United States Patent and Trademark Office*

UNITED STATES PATENT AND TRADEMARK OFFICE
CERTIFICATE OF CORRECTION

PATENT NO. : 8,799,244 B2  Page 1 of 1
APPLICATION NO. : 13/462861
DATED : August 5, 2014
INVENTOR(S) : Tofano It is certified that error appears in the above-identified patent and that said Letters Patent is hereby corrected as shown below:

In the Title Page, item (76):

In Inventors, delete "Shawn Hall, San Jose, CA (US)" as inventor.

Signed and Sealed this
Twenty-first Day of April, 2015

Michelle K. Lee
*Director of the United States Patent and Trademark Office*